United States Patent
Chang et al.

(10) Patent No.: US 10,460,790 B1
(45) Date of Patent: Oct. 29, 2019

(54) DETECTING CIRCUIT, DRAM, AND METHOD FOR DETERMINING A REFRESH FREQUENCY FOR A DELAY-LOCKED LOOP MODULE

(71) Applicant: NANYA TECHNOLOGY CORPORATION, New Taipei (TW)

(72) Inventors: Chuan-Jen Chang, Baoshan Township, Hsinchu County (TW); Wen-Ming Lee, Toufen (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/978,682

(22) Filed: May 14, 2018

(51) Int. Cl.
*G11C 11/406* (2006.01)
*H03L 7/085* (2006.01)
*G11C 11/4093* (2006.01)
*G11C 11/4091* (2006.01)

(52) U.S. Cl.
CPC ........ *G11C 11/406* (2013.01); *G11C 11/4091* (2013.01); *G11C 11/4093* (2013.01); *H03L 7/085* (2013.01)

(58) Field of Classification Search
None
See application file for complete search history.

(56) References Cited

U.S. PATENT DOCUMENTS

| 2004/0008063 A1* | 1/2004 | Kim | H03L 7/0812 327/158 |
| 2009/0309642 A1* | 12/2009 | Kim | H03H 11/26 327/261 |
| 2017/0093386 A1* | 3/2017 | Kitagawa | H03K 5/159 |

* cited by examiner

*Primary Examiner* — James G Norman
(74) *Attorney, Agent, or Firm* — Muncy, Geissler, Olds & Lowe, P.C.

(57) ABSTRACT

The present disclosure provides a detecting circuit. The detecting circuit includes a clock module, a clock receiver, a delay-locked loop module, a clock tree module, an off-chip driver, a pad, a phase detector, a voltage-detecting module and a control module. The clock module provides a clock signal to the clock receiver. The clock receiver sends the clock signal to the pad through the delay-locked loop module, the clock tree module and the off-chip driver. The control module is coupled to the voltage-detecting module and the delay-locked loop module. The voltage-detecting module is coupled between the control module and the clock tree module, and is configured to detect a voltage of the clock tree module and to send a voltage comparison information to the control module. The control module is configured to control a refresh frequency of the delay-locked loop module.

20 Claims, 10 Drawing Sheets

DETECTING CIRCUIT, DRAM, AND METHOD FOR DETERMINING A REFRESH FREQUENCY FOR A DELAY-LOCKED LOOP MODULE

TECHNICAL FIELD

The present disclosure relates to a detecting circuit, a DRAM and a method for determining a refresh frequency, and more particularly, to a detecting circuit, a DRAM and a method for determining a refresh frequency for a delay-locked loop module.

DISCUSSION OF THE BACKGROUND

A conventional DRAM circuit usually has access time shift problems, and the access time shift problems may lead to low DRAM data output effectiveness. The access time shift problems are usually caused by voltage drops, and are usually solved by elongating power buses or by increasing the quantity of capacitors.

However, as the required working frequency increases, and the required chip size decreases, it becomes increasingly difficult to elongate the power buses and increase the quantity of the capacitors. Therefore, it is necessary to find a solution to the access time shift problems that does not depend on elongating the power buses or increasing the quantity of the capacitors.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a detecting circuit. The detecting circuit includes a delay-locked loop module configured to maintain the timing relationship between a clock signal and a reference signal; a clock tree module coupled to the delay-locked loop module; and a voltage-detecting module coupled between the delay-locked loop module and the clock tree module, wherein the voltage-detecting module is configured to detect a voltage difference between the clock tree module and a reference voltage.

In some embodiments, the voltage-detecting module includes a voltage comparator coupled between the delay-locked loop module and the clock tree module, wherein the voltage comparator is configured to compare a voltage of the clock tree module with the reference voltage.

In some embodiments, the detecting circuit further comprises a control module coupled to the voltage-detecting module and the delay-locked loop module, wherein the control module is configured to control a refresh frequency of the delay-locked loop module based on a voltage comparison information from the voltage-detecting module.

In some embodiments, the detecting circuit further comprises a phase detector coupled between the delay-locked loop module and the clock tree module, wherein the phase detector is configured to detect a phase difference between the clock signal and the reference signal.

In some embodiments, the phase detector includes a phase comparator coupled between the delay-locked loop module and the clock tree module, and the phase comparator is configured to compare a phase of the clock signal with the reference signal.

In some embodiments, the detecting circuit further comprises a clock module configured to provide the clock signal, and a clock receiver coupled between the clock module and the delay-locked loop module.

In some embodiments, the detecting circuit further comprises an off-chip driver coupled to the clock tree module and configured to execute an impedance-adjusting procedure, and a pad coupled to the off-chip driver and configured to receive the clock signal from the off-chip driver.

Another aspect of the present disclosure provides a DRAM. The DRAM comprises a memory array, a plurality of sensing amplifiers coupled to the memory array, an I/O buffer coupled to the sensing amplifiers, and a clock generator coupled to the sensing amplifiers and the I/O buffer, wherein the clock generator comprises a delay-locked loop module configured to maintain a timing relationship between a clock signal and a reference signal; a clock tree module coupled to the delay-locked loop module; and a voltage-detecting module coupled between the delay-locked loop module and the clock tree module and configured to detect a voltage difference between the clock tree module and a reference voltage.

In some embodiments, the voltage-detecting module includes a voltage comparator coupled between the delay-locked loop module and the clock tree module, wherein the voltage comparator is configured to compare a voltage of the clock tree module with the reference voltage.

In some embodiments, the DRAM further comprises a control module coupled to the voltage-detecting module and the delay-locked loop module, wherein the control module is configured to control a refresh frequency of the delay-locked loop module based on a voltage comparison information from the voltage-detecting module.

In some embodiments, the detecting circuit further includes a phase detector coupled between the delay-locked loop module and the clock tree module, wherein the phase detector is configured to detect a phase difference between the clock signal and the reference signal.

In some embodiments, the phase detector includes a phase comparator coupled between the delay-locked loop module and the clock tree module, and the phase comparator is configured to compare a phase of the clock signal with the reference signal.

In some embodiments, when the delay-locked loop module operates at a low frequency, the delay-locked loop module is enabled to adjust the phase of the clock signal after receiving a preset quantity of continuous phase delays or continuous phase advances from the phase comparator.

In some embodiments, when the delay-locked loop module operates at a high frequency, the delay-locked loop module is enabled to adjust the phase of the clock signal after receiving a phase delay or a phase advance.

Another aspect of the present disclosure provides a method for determining a refresh frequency for a delay-locked loop module. The method comprises the following steps of: detecting a voltage of a clock tree module by a voltage-detecting module; comparing the voltage of the clock tree module with a reference voltage; sending a voltage comparison information to a control module; and increasing a refresh frequency of a delay-locked loop module from a preset frequency when the voltage of the clock tree module is decreasing from a high level that is greater than the reference voltage to a low level that is equal to or less than the reference voltage.

In some embodiments, the method further comprises the following step of maintaining the refresh frequency at a frequency higher than the preset frequency when the voltage of the clock tree module remains at the low level after the refresh frequency is increased.

In some embodiments, the method further comprises the following step of maintaining the refresh frequency at a frequency higher than the preset frequency when the voltage of the clock tree module remains at the low level after the refresh frequency is increased.

In some embodiments, the method further comprises the following step of maintaining the refresh frequency at the preset frequency when the voltage of the clock tree module remains at the high level after the refresh frequency returns to the preset frequency.

In some embodiments, the method further comprises the following step of enabling the delay-locked loop module to adjust the phase of the clock signal when the delay-locked loop module operates at a low refresh frequency and receives a preset quantity of continuous phase delays or continuous phase advances from the phase comparator.

In some embodiments, the method further comprises the following step of enabling the delay-locked loop module to adjust the phase of the clock signal when the delay-locked loop module operates at a high frequency and receives a phase delay or a phase advance.

With the above-mentioned configurations of the detecting circuit, a refresh frequency can be adjusted promptly when the voltage of the clock tree module varies. In addition, the access time shift problem can be solved without elongating power buses and without increasing the quantity of capacitors. Consequently, the disadvantages of a conventional DRAM circuit can be alleviated.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
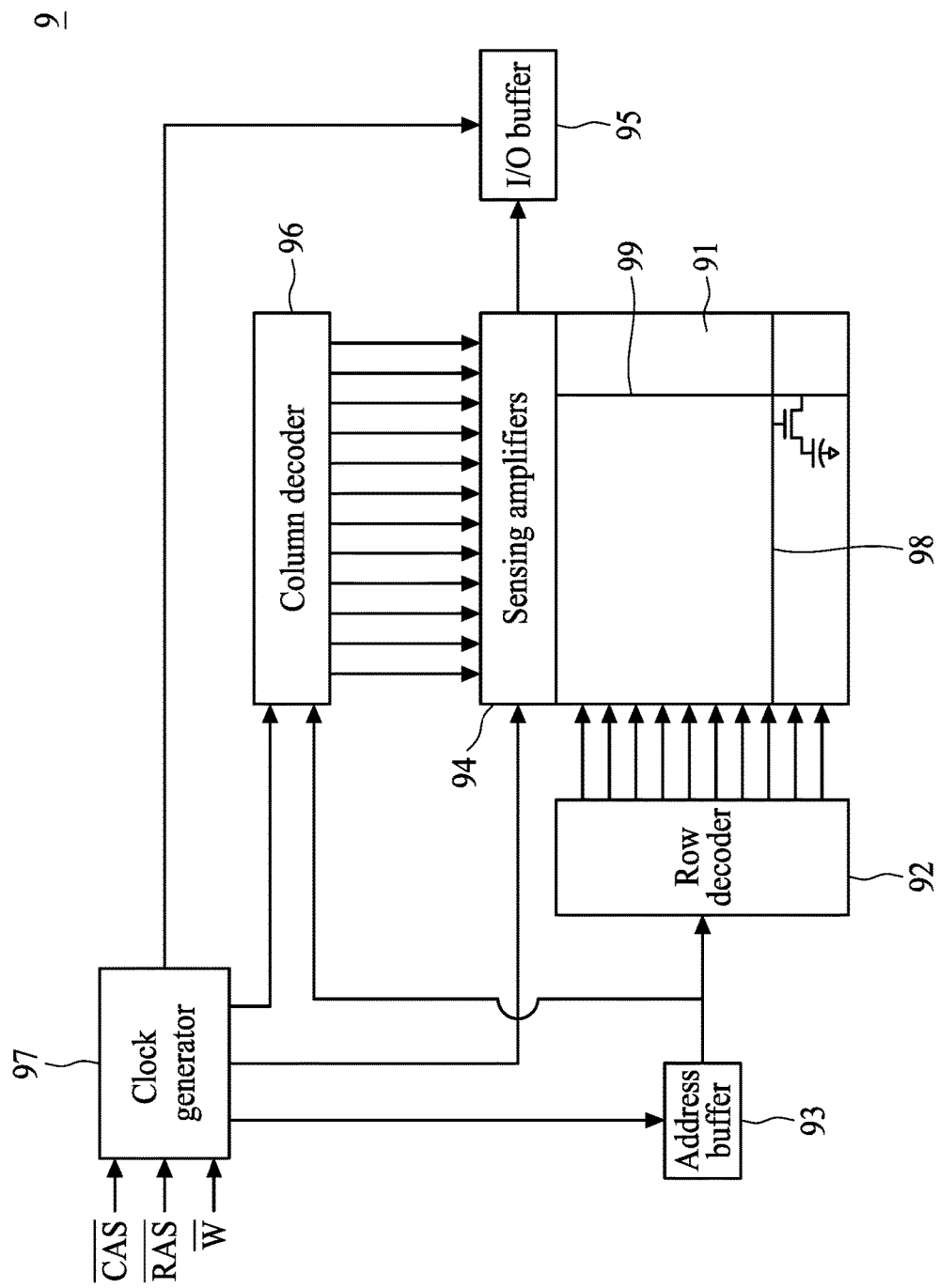
FIG. 1 is a block diagram of a DRAM in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a block diagram of a DRAM 9 in accordance with some embodiments of the present disclosure. Referring to FIG. 1, the DRAM 9 comprises a memory array 91; a row decoder 92 coupled to the memory array 91; an address buffer 93 coupled to the row decoder 92; a plurality of sensing amplifiers 94 coupled to the memory array 91; an I/O buffer 95 coupled to the sensing amplifiers 94; a column decoder 96 coupled to the sensing amplifiers 94; a clock generator 97 coupled to the address buffer 93, the column decoder 96, the sensing amplifiers 94 and the I/O buffer 95; a plurality of word lines 98 extending through the memory array 91; and a plurality of bit lines 99 extending through the memory array 91 and intersecting word lines 98.

Figure 2:
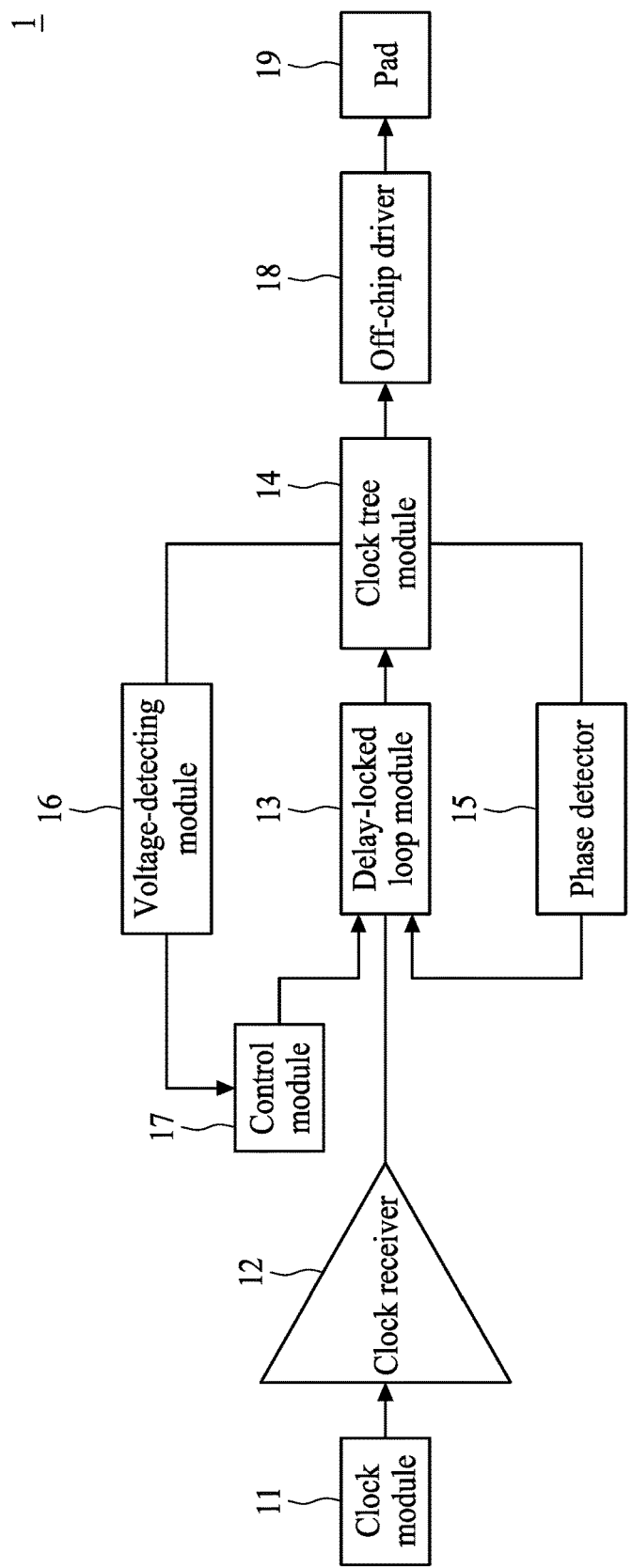
FIG. 2 is a block diagram of a detecting circuit of the DRAM in accordance with some embodiments of the present disclosure.

FIG. 2 is a block diagram of a detecting circuit 1 in accordance with some embodiments of the present disclosure. Referring to FIG. 1 and FIG. 2, in some embodiments, the clock generator 97 includes the detecting circuit 1. In some embodiments, the detecting circuit 1 comprises a clock module 11, a clock receiver 12, a delay-locked loop module 13, a clock tree module 14, a phase detector 15, a voltage-detecting module 16, a control module 17, an off-chip driver 18 and a pad 19. In some embodiments, the clock module 11 is configured to provide a clock signal, the clock receiver 12 is coupled between the clock module 11 and the delay-locked loop module 13, the delay-locked loop module 13 is configured to maintain a timing relationship between the clock signal and a reference signal, and the clock tree module 14 is coupled to the delay-locked loop module 13.

Figure 3:
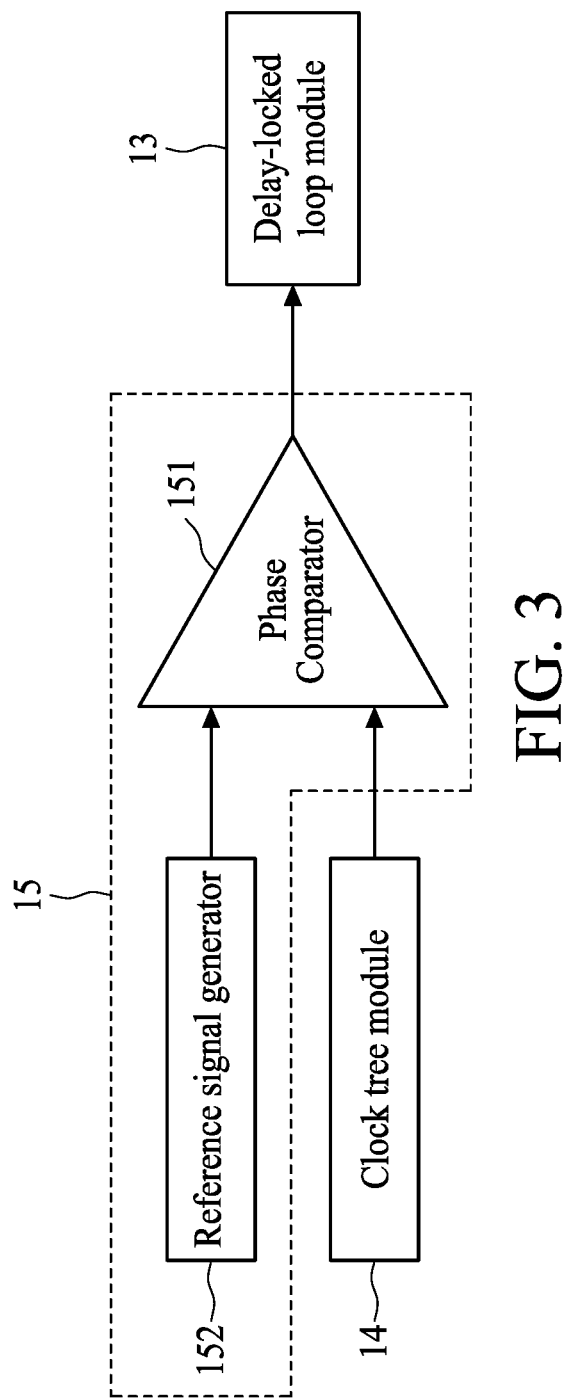
FIG. 3 is a block diagram of a phase detector of the detecting circuit in accordance with some embodiments of the present disclosure.
Figure 4:
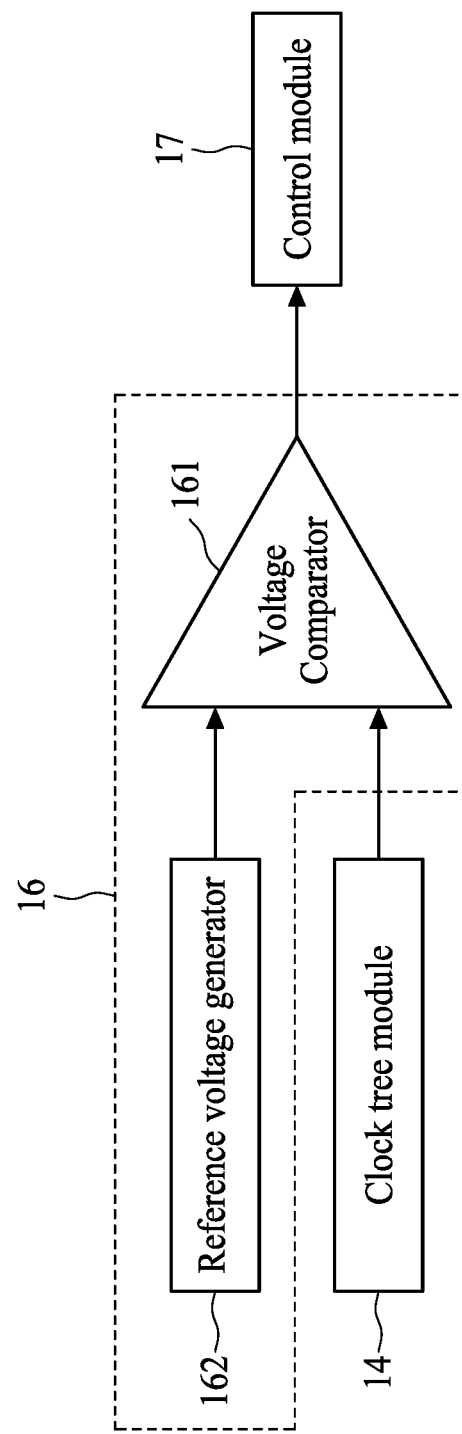
FIG. 4 is a block diagram of a voltage-detecting module of the detecting circuit in accordance with some embodiments of the present disclosure.

FIG. 3 is a block diagram of the phase detector 15 of the detecting circuit 1 in accordance with some embodiments of the present disclosure, and FIG. 4 is a block diagram of the voltage-detecting module 16 of the detecting circuit 1 in accordance with some embodiments of the present disclosure. Referring to FIG. 2 and FIG. 3, in some embodiments, the phase detector 15 includes a phase comparator 151 coupled between the delay-locked loop module 13 and the clock tree module 14, and the phase detector 15 is configured to detect a phase difference between the clock signal from the clock tree module 14 and the reference signal from a reference signal generator 152. In some embodiments, the phase comparator 151 is configured to compare the phase of the clock signal with the phase of the reference signal. In some embodiments, two input terminals of the phase comparator 151 are respectively coupled to the clock tree module 14 and the reference signal generator 152, and the output terminal of the phase comparator 151 is coupled to the delay-locked loop module 13.

Referring to FIG. 2 and FIG. 4, in some embodiments, the voltage-detecting module 16 includes a voltage comparator 161 coupled between the control module 17 and the clock tree module 14, and the voltage-detecting module 16 is configured to detect a voltage difference between the clock tree module 14 and a reference voltage (VR). In some embodiments, the voltage comparator 161 is configured to compare a voltage of the clock tree module 14 with the reference voltage (VR) from a reference voltage generator 162. In some embodiments, two input terminals of the voltage comparator 161 are respectively coupled to the clock tree module 14 and the reference voltage generator 162, and the output terminal of the voltage comparator 161 is coupled to the control module 17.

Referring to FIG. 2, in some embodiments, the control module 17 is coupled to the voltage-detecting module 16 and the delay-locked loop module 13, wherein the control module 17 is configured to control a refresh frequency of the delay-locked loop module 13 based on a voltage comparison information from the voltage-detecting module 16.

Referring to FIG. 2, in some embodiments, the off-chip driver 18 is coupled to the clock tree module 14 and is configured to execute an impedance-adjusting procedure. In some embodiments, the pad 19 is coupled to the off-chip driver 18 and is configured to receive the clock signal from the off-chip driver 18.

Figure 5:
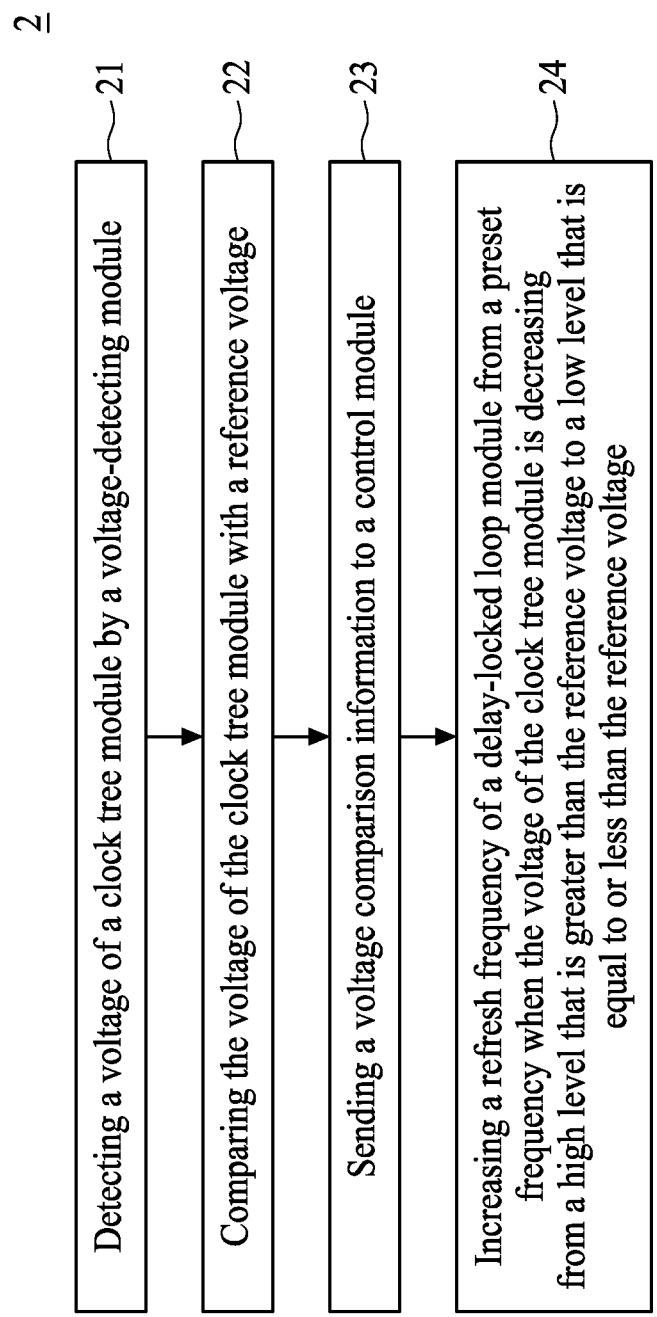
FIG. 5 is a flow chart illustrating a method for determining a refresh frequency for a delay-locked loop module in accordance with some embodiments of the present disclosure.

FIG. 5 is a flow chart illustrating a method 2 for determining the refresh frequency for the delay-locked loop module 13 in accordance with some embodiments of the present disclosure. In some embodiments, the method 2 for determining the refresh frequency for the delay-locked loop module 13 includes a step 21: The voltage of the clock tree module 14 is detected by the voltage-detecting module 16; a step 22: The voltage of the clock tree module 14 is compared with the reference voltage (VR); a step 23: The voltage comparison information is sent to the control module 17; and a step 24: The refresh frequency of the delay-locked loop module 13 is increased when the voltage of the clock tree module 14 is decreasing from a high level that is greater than the reference voltage (VR) to a low level that is equal to or less than the reference voltage (VR).

Figure 6:
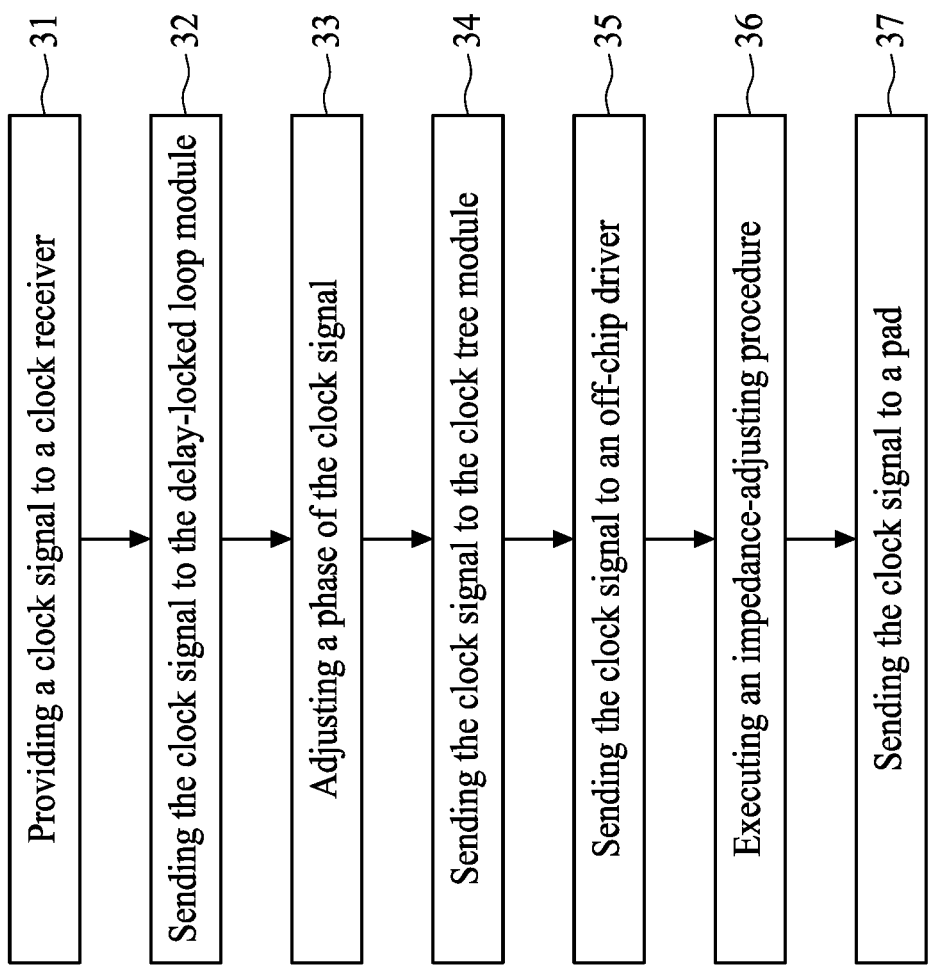
FIG. 6 is a flow chart illustrating a clock-signal-adjusting process of the detecting circuit in accordance with some embodiments of the disclosure.

FIG. 6 is a flow chart illustrating a clock-signal-adjustment process 3 of the detecting circuit 1 in accordance with some embodiments of the disclosure. In some embodiments, the clock signal adjustment process 3 includes a step 31: providing the clock signal to the clock receiver 12; a step 32: sending the clock signal to the delay-locked loop module 13; a step 33: adjusting the phase of the clock signal; a step 34: sending the clock signal to the clock tree module 14; a step 35: sending the clock signal to the off-chip driver 18; a step 36: executing an impedance-adjusting procedure; and a step 37: sending the clock signal to the pad 19.

Figure 7:
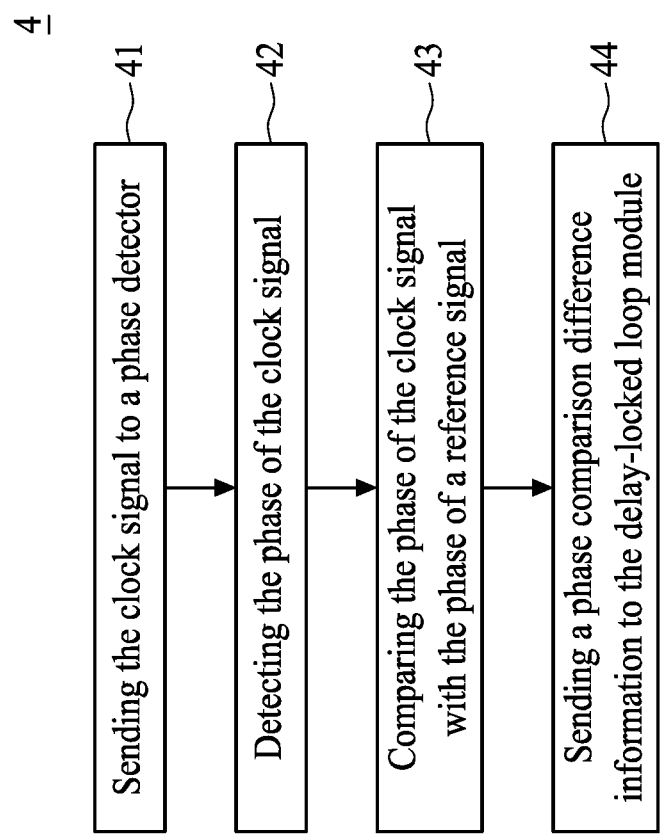
FIG. 7 is a flow chart illustrating a phase-detecting process of a phase detector of the detecting circuit in accordance with some embodiments of the disclosure.

FIG. 7 is a flow chart illustrating a phase-detecting process 4 of the phase detector 15 of the detecting circuit 1 in accordance with some embodiments of the disclosure. In some embodiments, the phase-detecting process 4 includes a step 41: sending the clock signal to the phase detector 15; a step 42: detecting the phase of the clock signal; a step 43: comparing the phase of the clock signal with the phase of the reference signal; and a step 44: sending a phase comparison information to the delay-locked loop module 13.

Figure 8:
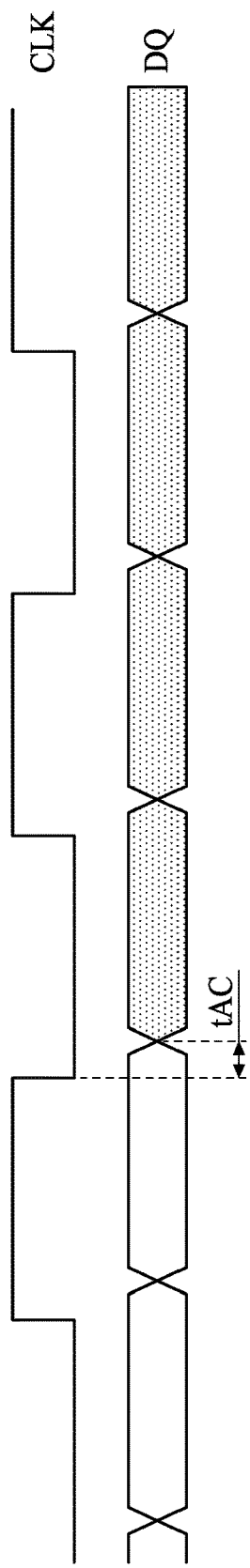
FIG. 8 is a schematic view illustrating an access time shift.

FIG. 8 is a schematic view illustrating an access time shift. Referring to FIG. 8, during a DRAM data output process, the DRAM usually requires time for preparing data output. The required time for preparing the data output is called access time (tAC). The access time is the length of a period between the beginning of the data output and the beginning of a high state of a clock signal, wherein the high state is ahead of and nearest to the time of data output. In a comparative embodiment, when the voltage of a clock tree module drops rapidly, the delay-locked loop module is not able to adjust the phase of the clock signal rapidly, so the access time is prolonged and the DRAM data output effectiveness is negatively affected. In some embodiments, when the voltage of the clock tree module 14 drops rapidly, the refresh frequency of the delay-locked loop module 13 is increased to adjust the phase of the clock signal rapidly. As a result, the prolonging of the access time can be prevented and the DRAM data output effectiveness can be prevented from being negatively affected.

Referring back to FIG. 2 and FIG. 6 in some embodiments, during the clock-signal-adjustment process, the clock signal is provided by the clock module 11 through the clock receiver 12, the delay-locked loop module 13, the clock tree module 14 and the off-chip driver 18 to the pad 19, and the phase detector 15 and the voltage-detecting module 16 respectively and simultaneously detect the phase and the voltage of the clock signal passing through the clock tree module 14. Subsequently, the voltage-detecting module 16 sends the voltage comparison information to the control module 17. In some embodiments, after the voltage comparison information is received, the control module 17 sends control signals to control the refresh frequency of the delay-locked loop module 13 based on the voltage comparison information from the voltage-detecting module 16. In some embodiments, when clock signals are continuously provided, the phase detector 15 continuously sends the phase comparison information to the delay-locked loop module 13.

Figure 9:
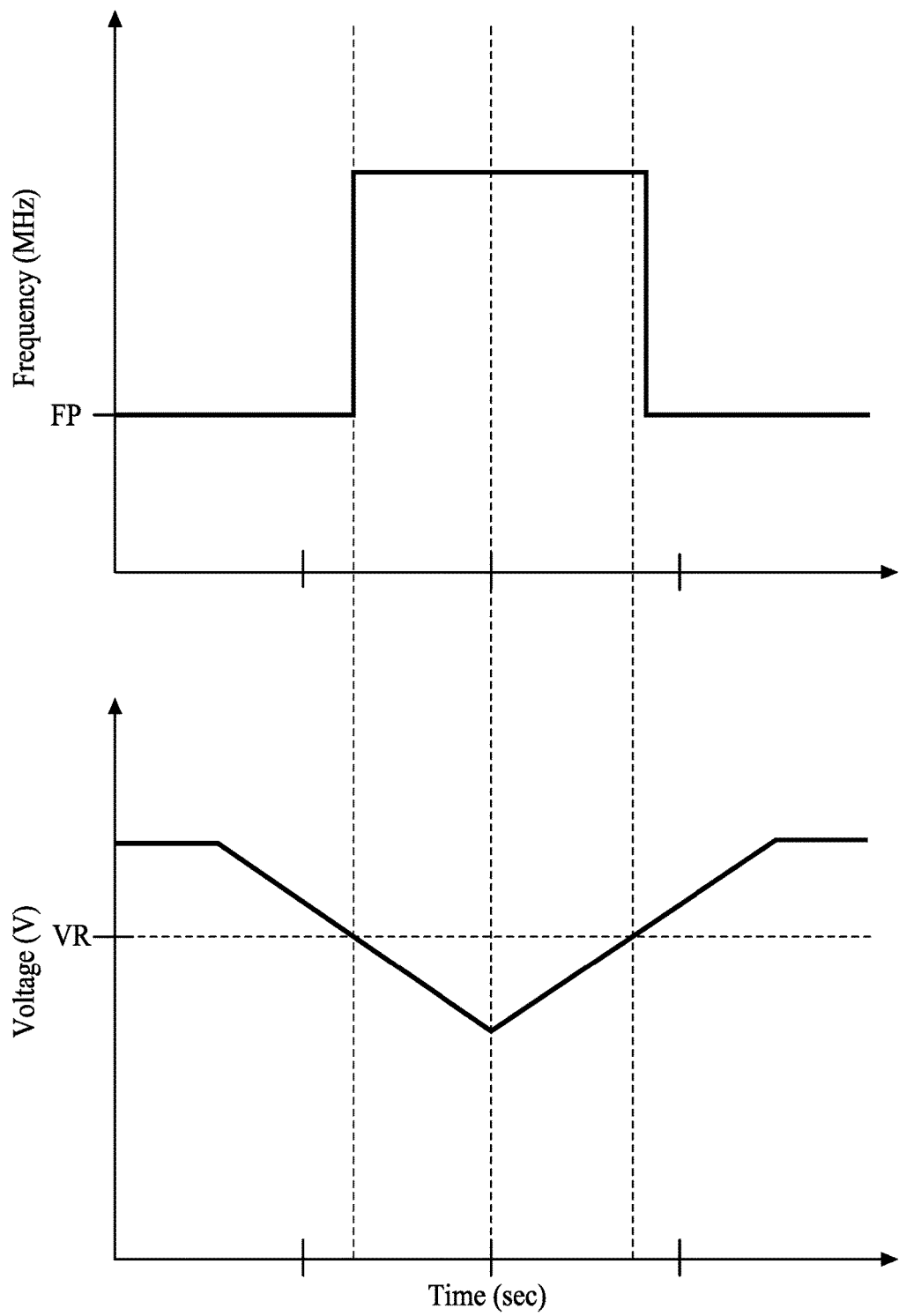
FIG. 9 is a schematic plot illustrating the variation relationship between a voltage of a clock tree module and the refresh frequency for the delay-locked loop module.

FIG. 9 is a schematic plot illustrating the variation relationship between the voltage of the clock tree module 14 and the refresh frequency for the delay-locked loop module 13. Referring to FIG. 2 and FIG. 9, in some embodiments, the control module 17 first receives the voltage comparison information from the voltage-detecting module 16, and the control module 17 sends the control signals to the delay-locked loop module 13 to adjust the refresh frequency. In some embodiments, the control module 17 sends a control signal to the delay-locked loop module 13 to increase the refresh frequency of the delay-locked loop module 13 from a preset frequency (FP) when the voltage of the clock tree module 14 is decreasing from the high level to the low level that is equal to the reference voltage (VR); subsequently, after the refresh frequency is increased, the refresh frequency of the delay-locked loop module 13 is maintained at a frequency higher than the preset frequency (FP) when the voltage of the clock tree module 14 remains at the low level.

In some embodiments, the control module 17 sends another control signal to the delay-locked loop module 13 to return the refresh frequency of the delay-locked loop module 13 to the preset frequency (FP) when the voltage of the clock tree module 14 increases from the low level to the high level. In some embodiments, after the refresh frequency returns to the preset frequency (FP), the refresh frequency of the delay-locked loop module 13 is maintained at the preset frequency (FP) when the voltage of the clock tree module 14 remains at the high level.

Figure 10:
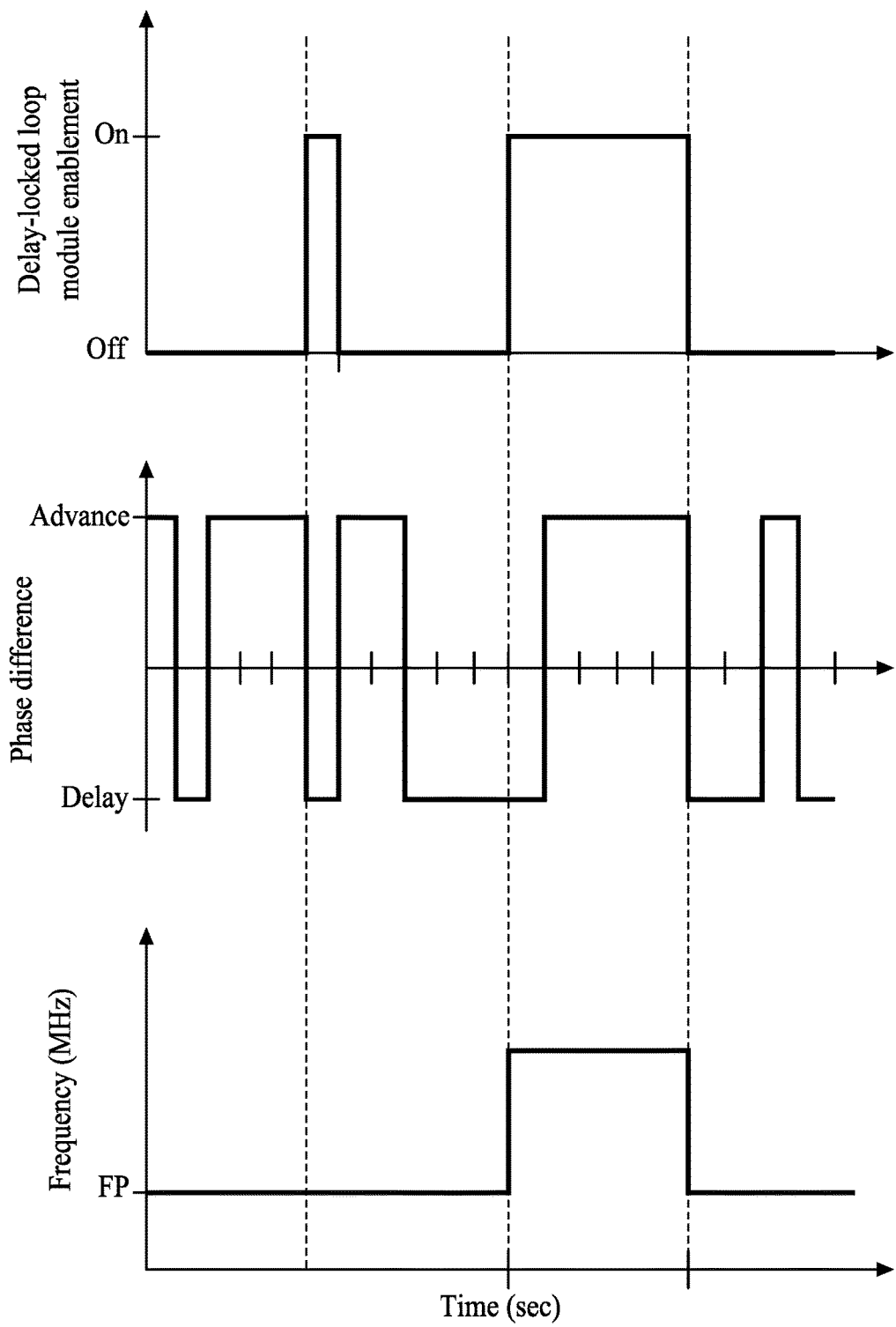
FIG. 10 is a schematic plot illustrating the variation relationship among the refresh frequency of the delay-locked loop module, the phase difference between a clock signal and a reference signal, and a refreshing process enablement of the delay-locked loop module.

FIG. 10 is a schematic plot illustrating the variation relationship among the refresh frequency of the delay-locked loop module 13, the phase difference between the clock signal and the reference signal, and a refreshing process enablement of the delay-locked loop module 13. Referring to FIG. 10, in some embodiments, there are two kinds of phase differences respectively representing a phase delay or a phase advance. In some embodiments, when the refresh frequency of the delay-locked loop module 13 is at the preset frequency (FP), the delay-locked loop module 13 is enabled (turn on) to adjust the phase of the clock signal after receiving a preset quantity of continuous phase delays or continuous phase advances, for example, after receiving three continuous phase delays or three continuous phase advances. In some embodiments, when the refresh frequency of the delay-locked loop module 13 is at a low frequency such as the preset frequency (FP), and the delay-locked loop module 13 receives discontinuous phase delays or discontinuous phase advances, or receives a quantity of continuous phase delays or continuous phase advance that is less than the preset quantity, the delay-locked loop module 13 is disabled (turn off) to adjust the phase of the clock signal. In some embodiments, after the refresh frequency of the delay-locked loop module 13 is increased to a high frequency, the delay-locked loop module 13 is enabled (turn on) to adjust the phase of the clock signal after receiving each phase delay or each phase advance.

In some embodiments, the voltage-detecting module 16 includes one voltage comparator 161 in the drawings, while, in some other embodiments, the quantity of the voltage comparator 161 may be varied. When the quantity of the voltage comparator 161 is increased, the numerical accuracy of the voltage of the clock tree module 14 is also increased correspondingly.

In conclusion, with the disposition of the detecting circuit 1, the timing relationship between the clock signal and the reference signal can be maintained by detecting the voltage of the clock tree module 14. Thus, the negative effect from the access time shift can be alleviated. Consequently, the objective of the disclosure is achieved.

One aspect of the present disclosure provides a detecting circuit. The detecting circuit includes a delay-locked loop module configured to maintain the timing relationship between a clock signal and a reference signal; a clock tree module coupled to the delay-locked loop module; and a voltage-detecting module coupled between the delay-locked loop module and the clock tree module, wherein the voltage-detecting module is configured to detect a voltage difference between the clock tree module and a reference voltage.

One aspect of the present disclosure provides a DRAM. The DRAM comprises a memory array, a plurality of sensing amplifiers coupled to the memory array, an I/O buffer coupled to the sensing amplifiers, and a clock generator coupled to the sensing amplifiers and the I/O buffer, wherein the clock generator comprises a delay-locked loop module configured to maintain a timing relationship between a clock signal and a reference signal; a clock tree module coupled to the delay-locked loop module; and a voltage-detecting module coupled between the delay-locked loop module and the clock tree module and configured to detect a voltage difference between the clock tree module and a reference voltage.

One aspect of the present disclosure provides a method for determining a refresh frequency for a delay-locked loop module. The method comprises the following steps. A voltage of a clock tree module is detected by a voltage-detecting module. The voltage of the clock tree module is compared with a reference voltage. A voltage comparison information is sent to a control module. A refresh frequency of a delay-locked loop module is increased from a preset frequency when the voltage of the clock tree module is decreasing from a high level that is greater than the reference voltage to a low level that is equal to or less than the reference voltage.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A detecting circuit, comprising:
   a delay-locked loop module configured to maintain a timing relationship between a clock signal and a reference signal;
   a clock tree module coupled to the delay-locked loop module; and a voltage-detecting module coupled between the delay-locked loop module and the clock tree module and configured to detect a voltage difference between the clock tree module and a reference voltage.

2. The detecting circuit of claim 1, wherein the voltage-detecting module includes a voltage comparator coupled between the delay-locked loop module and the clock tree module and configured to compare a voltage of the clock tree module with the reference voltage.

3. The detecting circuit of claim 1, further comprising a control module coupled to the voltage-detecting module and the delay-locked loop module, wherein the control module is configured to control a refresh frequency of the delay-locked loop module based on a voltage comparison information from the voltage-detecting module.

4. The detecting circuit of claim 1, further comprising a phase detector coupled between the delay-locked loop module and the clock tree module, wherein the phase detector is configured to detect a phase difference between the clock signal and the reference signal.

5. The detecting circuit of claim 4, wherein the phase detector includes a phase comparator coupled between the delay-locked loop module and the clock tree module, and the phase comparator is configured to compare a phase of the clock signal with the reference signal.

6. The detecting circuit of claim 5, wherein when the delay-locked loop module operates at a low frequency, the delay-locked loop module is enabled to adjust the phase of the clock signal after receiving a preset quantity of continuous phase delays or continuous phase advances from the phase comparator.

7. The detecting circuit of claim 5, wherein when the delay-locked loop module operates at a high frequency, the delay-locked loop module is enabled to adjust the phase of the clock signal after receiving a phase delay or a phase advance.

8. A DRAM, comprising:
a memory array;
a plurality of sensing amplifiers coupled to the memory array;
an I/O buffer coupled to the sensing amplifiers; and
a clock generator coupled to the sensing amplifiers and the I/O buffer, wherein the clock generator comprises:
a delay-locked loop module configured to maintain a timing relationship between a clock signal and a reference signal;
a clock tree module coupled to the delay-locked loop module; and
a voltage-detecting module coupled between the delay-locked loop module and the clock tree module and configured to detect a voltage difference between the clock tree module and a reference voltage.

9. The DRAM of claim 8, wherein the voltage-detecting module includes a voltage comparator coupled between the delay-locked loop module and the clock tree module and configured to compare a voltage of the clock tree module with the reference voltage.

10. The DRAM of claim 8 further comprising a control module coupled to the voltage-detecting module and the delay-locked loop module, wherein the control module is configured to control a refresh frequency of the delay-locked loop module based on a voltage comparison information from the voltage-detecting module.

11. The DRAM of claim 8, wherein the detecting circuit further includes a phase detector coupled between the delay-locked loop module and the clock tree module, wherein the phase detector is configured to detect a phase difference between the clock signal and the reference signal.

12. The DRAM of claim 11, wherein the phase detector includes a phase comparator coupled between the delay-locked loop module and the clock tree module, and the phase comparator is configured to compare a phase of the clock signal with the reference signal.

13. The DRAM of claim 12, wherein when the delay-locked loop module operates at a low frequency, the delay-locked loop module is enabled to adjust the phase of the clock signal after receiving a preset quantity of continuous phase delays or continuous phase advances from the phase comparator.

14. The DRAM of claim 12, wherein when the delay-locked loop module operates at a high frequency, the delay-locked loop module is enabled to adjust the phase of the clock signal after receiving a phase delay or a phase advance.

15. A method, comprising:
detecting a voltage of a clock tree module by a voltage-detecting module;
comparing the voltage of the clock tree module with a reference voltage;
sending a voltage comparison information to a control module; and
increasing a refresh frequency of a delay-locked loop module from a preset frequency when the voltage of the clock tree module is decreasing from a high level that is greater than the reference voltage to a low level that is equal to or less than the reference voltage.

16. The method of claim 15, further comprising:
maintaining the refresh frequency at a frequency higher than the preset frequency when the voltage of the clock tree module remains at the low level after the refresh frequency is increased.

17. The method of claim 16, further comprising:
returning the refresh frequency to the preset frequency when the voltage of the clock tree module is increasing from the low level to the high level.

18. The method of claim 17, further comprising:
maintaining the refresh frequency at the preset frequency when the voltage of the clock tree module remains at the high level after the refresh frequency returns to the preset frequency.

19. The method of claim 15, further comprising:
enabling the delay-locked loop module to adjust the phase of the clock signal when the delay-locked loop module operates at a low refresh frequency and receives a preset quantity of continuous phase delays or continuous phase advances from the phase comparator.

20. The method of claim 15, further comprising:
enabling the delay-locked loop module to adjust the phase of the clock signal when the delay-locked loop module operates at a high frequency and receives a phase delay or a phase advance.

* * * * *